(12) United States Patent
Mikawa et al.

(10) Patent No.: US 10,891,532 B2
(45) Date of Patent: Jan. 12, 2021

(54) TRAY

(71) Applicants: JAPAN AVIATION ELECTRONICS INDUSTRY, LIMITED, Tokyo (JP); JAE HONG KONG, LTD., Hong Kong (CN)

(72) Inventors: Kazuya Mikawa, Tokyo (JP); Ting Wang, Hong Kong (CN)

(73) Assignees: JAPAN AVIATION ELECTRONICS INDUSTRY, LIMITED, Tokyo (JP); JAE HONG KONG, LTD., Hong Kong (CN)

(*) Notice: Subject to any disclaimer, the term of this patent is extended or adjusted under 35 U.S.C. 154(b) by 0 days.

(21) Appl. No.: 16/380,132

(22) Filed: Apr. 10, 2019

(65) Prior Publication Data

US 2019/0362214 A1 Nov. 28, 2019

(30) Foreign Application Priority Data

May 22, 2018 (JP) .................................. 2018-098164

(51) Int. Cl.
*G06K 19/077* (2006.01)
*H05K 5/02* (2006.01)
*G06K 7/00* (2006.01)

(52) U.S. Cl.
CPC ..... *G06K 19/07739* (2013.01); *G06K 7/0056* (2013.01); *H05K 5/0282* (2013.01)

(58) Field of Classification Search
CPC ................ H01R 13/635; H01R 12/712; G06K 13/0831; G06K 19/07739; G06K 7/0056; H05K 5/0282
See application file for complete search history.

(56) References Cited

U.S. PATENT DOCUMENTS

| 8,597,058 B2 | 12/2013 | Lin et al. |
| 9,124,042 B2 | 9/2015 | Matsunaga |

(Continued)

FOREIGN PATENT DOCUMENTS

| CN | 107611706 A | 1/2018 |
| JP | 2012146488 A | 8/2012 |

(Continued)

OTHER PUBLICATIONS

Taiwanese Office Action dated Dec. 27, 2019 (and English translation thereof) issued in Taiwanese Application No. 108110911.

(Continued)

*Primary Examiner* — Laura A Gudorf
(74) *Attorney, Agent, or Firm* — Holtz, Holtz & Volek PC

(57) ABSTRACT

A tray is insertable forward in a front-rear direction into a connector main of a card connector. The tray has a first card accommodation portion and a second card accommodation portion. The first card accommodation portion is positioned at a position different from a position of the second card accommodation portion in an up-down direction perpendicular to the front-rear direction. The first card accommodation portion has a first elastic beam portion, a first facing portion and a first bulge. The second card accommodation portion has a second elastic beam portion, a second facing portion, and a second bulge. The first elastic beam portion and the second elastic beam portion are positioned at positions different from each other in the front-rear direction. The first elastic beam portion and the second elastic beam portion are elastically deformable independently of each other.

7 Claims, 7 Drawing Sheets

(56) References Cited

U.S. PATENT DOCUMENTS

2013/0252470 A1* 9/2013 Lin .................... H04B 1/3816
                                                        439/630
2017/0172004 A1   6/2017 Yang et al.
2018/0092231 A1*  3/2018 Choi ................... H04B 1/3818
2018/0309234 A1* 10/2018 Huang ................ H01R 13/639

FOREIGN PATENT DOCUMENTS

| JP | 2014225084 A | 12/2014 |
| JP | 2017107838 A | 6/2017 |
| KR | 20120068997 A | 6/2012 |
| KR | 20170000241 A | 1/2017 |
| KR | 20170136192 A | 12/2017 |
| KR | 101823332 B1 | 1/2018 |

OTHER PUBLICATIONS

Chinese Office Action (and English language translation thereof) dated Jun. 1, 2020 issued in Chinese Application No. 201910316482.4.

Korean Office Action (and English language translation thereof) dated Jun. 19, 2020 issued in Korean Application No. 10-2019-0045886.

Chinese Office Action (and English language translation thereof) dated Oct. 27, 2020 issued in Chinese Application No. 201910316482.4.

* cited by examiner

TRAY

CROSS REFERENCE TO RELATED APPLICATIONS

This application is based on and claims priority under 35 U.S.C. § 119 to Japanese Patent Application No. JP2018-098164 filed May 22, 2018, the contents of which are incorporated herein in their entireties by reference.

BACKGROUND OF THE INVENTION

This invention relates to a tray which is used for a card connector.

Referring to FIGS. 13 to 14, U.S. Pat. No. 8,597,058 (Patent Document 1) discloses a card convert adapter 910 which converts a micro SIM (Subscribed Identity Module) card 950 into a standard SIM card. The card convert adapter 910 has a card accommodation portion 920 which is configured to accommodate the micro SIM card 950. The card accommodation portion 920 has an elastic beam portion 922, a facing portion 926 and a bulge 924. The elastic beam portion 922 is elastically deformable. The facing portion 926 faces the elastic beam portion 922 in a front-rear direction, or in an X-direction. The bulge 924 is bulged toward the facing portion 926 from the elastic beam portion 922. When the micro SIM card 950 is accommodated in the card accommodation portion 920 of the card convert adapter 910, the elastic beam portion 922 is elastically deformed so that the micro SIM card 950 is held by the bulge portion 924 and the facing portion 926.

Recently, a tray, which is used for a card connector included in a smartphone, etc., is required to be able to independently hold a plurality of cards such as a nano SIM card and a micro SD (Secure Digital) card. Additionally, a card connector, which is included in such a smartphone, etc., is required to have a reduced horizontal dimension because the card connector having the reduced horizontal dimension is beneficial for a layout of inner parts of the smartphone therein. One possible approach, which reduces a horizontal dimension of a card connector while also holding a plurality of cards on a tray, is to hold cards on opposite sides of the tray.

SUMMARY OF THE INVENTION

It is therefore an object of the present invention to provide a tray which is used for a card connector and which can independently hold a plurality of cards on opposite sides of the tray.

One aspect of the present invention provides a tray insertable forward in a front-rear direction into a connector main of a card connector. The tray has a first card accommodation portion and a second card accommodation portion. The first card accommodation portion is positioned at a position different from a position of the second card accommodation portion in an up-down direction perpendicular to the front-rear direction. The first card accommodation portion has a first elastic beam portion, a first facing portion and a first bulge. The first facing portion faces the first elastic beam portion in the front-rear direction. The first bulge is bulged toward the first facing portion from the first elastic beam portion. The second card accommodation portion has a second elastic beam portion, a second facing portion, and a second bulge. The second facing portion faces the second elastic beam portion in the front-rear direction. The second bulge is bulged toward the second facing portion from the second elastic beam portion. The first elastic beam portion and the second elastic beam portion are positioned at positions different from each other in the front-rear direction. The first elastic beam portion and the second elastic beam portion are elastically deformable independently of each other.

The tray of the present invention has the first card accommodation portion and the second card accommodation portion, wherein the first card accommodation portion is positioned at the position different from the position of the second card accommodation portion in the up-down direction. In addition, the tray of the present invention has the features as follows: the first card accommodation portion has the first elastic beam portion, the first facing portion and the first bulge; the second card accommodation portion has the second elastic beam portion, the second facing portion and the second bulge; and the first elastic beam portion and the second elastic beam portion are elastically deformable independently of each other. Accordingly, the tray of the present invention is configured to be able to independently hold a plurality of cards on opposite sides of the tray.

An appreciation of the objectives of the present invention and a more complete understanding of its structure may be had by studying the following description of the preferred embodiment and by referring to the accompanying drawings.

Figure 1:
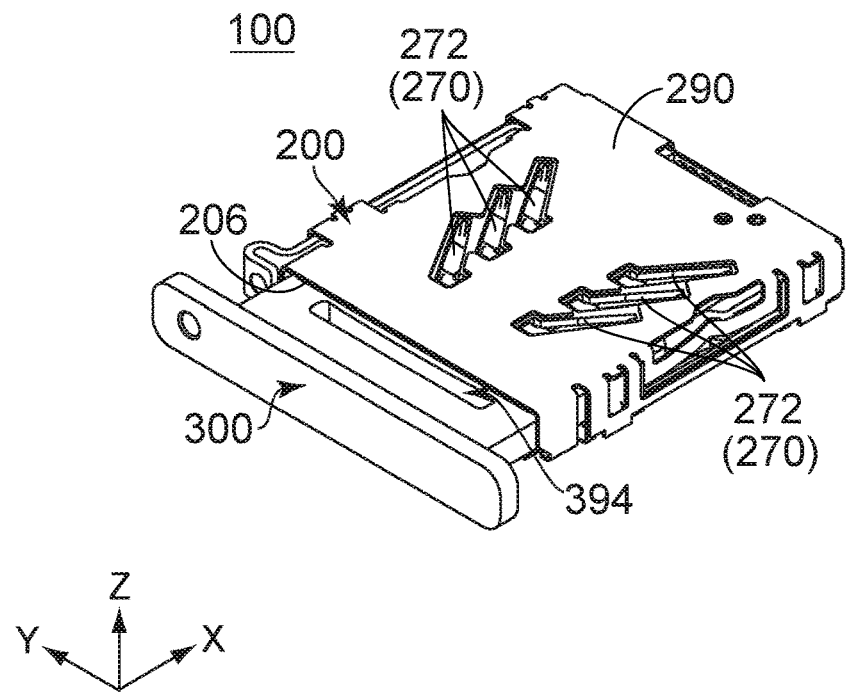
FIG. 1 is a perspective view showing a card connector according to an embodiment of the present invention. In the figure, the card connector is in a received state where a tray is received in a connector main.
Figure 2:
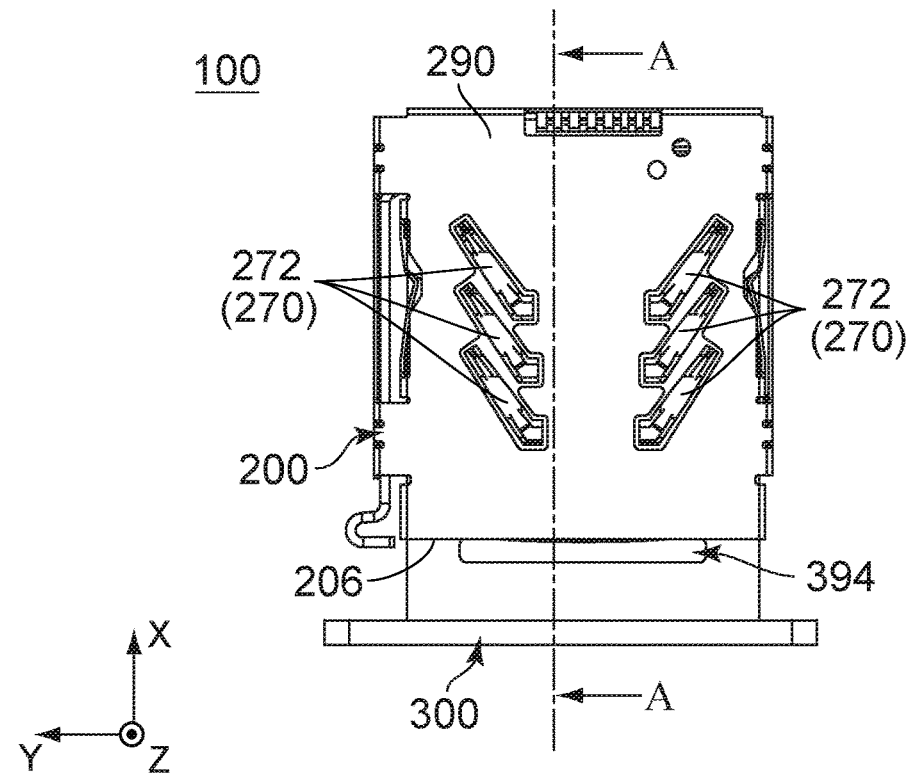
FIG. 2 is a top view showing the card connector of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

As shown in FIG. 1, a card connector 100 according to an embodiment of the present invention comprises a connector main 200 and a tray 300.

Figure 3:
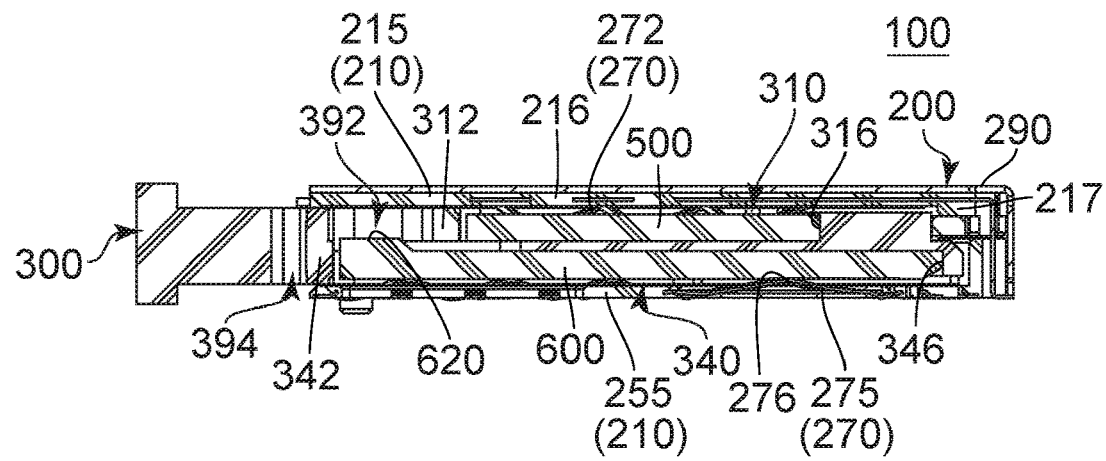
FIG. 3 is a cross-sectional view showing the card connector of FIG. 2, taken along line A-A.

As shown in FIG. 3, the connector main 200 of the present embodiment receives the tray 300 along a front-rear direction. More specifically, the connector main 200 receives the tray 300 through its rear end along the front-rear direction. In the present embodiment, the front-rear direction is an X-direction. Specifically, forward is a positive X-direction, and rearward is a negative X-direction.

Figure 7:
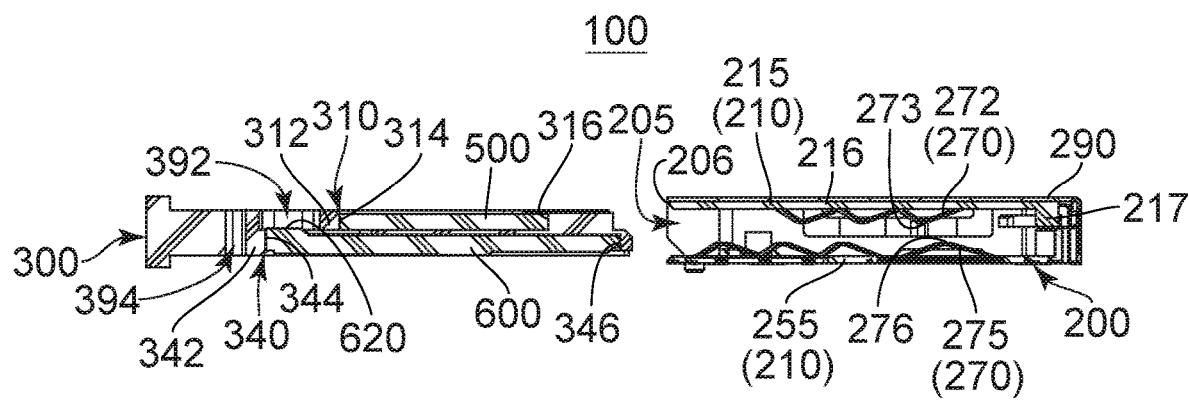
FIG. 7 is a cross-sectional view showing the card connector of FIG. 6, taken along line B-B.

As shown in FIG. 7, the connector main 200 of the present embodiment has a housing 210, a plurality of terminals 270, a shell 290 and a tray receiving portion 205.

Referring to FIG. 7, the housing 210 of the present embodiment is made of insulator. Specifically, the housing 210 includes a first housing 215 and a second housing 255.

As shown in FIG. 7, the first housing 215 of the present embodiment has a flat plate portion 216 and a protruding portion 217.

Referring to FIG. 7, the flat plate portion 216 of the present embodiment has a substantially plate-like shape perpendicular to an up-down direction. In the present embodiment, the up-down direction is a Z-direction. Specifically, it is assumed that upward is a positive Z-direction while downward is a negative Z-direction.

Referring to FIG. 7, the protruding portion 217 of the present embodiment extends in a width direction perpendicular to both the front-rear direction and the up-down direction. In the present embodiment, the width direction is a Y-direction. The protruding portion 217 protrudes downward in the up-down direction from the flat plate portion 216. Specifically, a lower end of the protruding portion 217 is positioned below a lower end of the flat plate portion 216. The protruding portion 217 defines a front end of the first housing 215.

Referring to FIG. 7, the second housing 255 of the present embodiment has a substantially plate-like shape perpendicular to the up-down direction. The second housing 255 is positioned below the first housing 215 in the up-down direction.

As shown in FIG. 7, the terminals 270 of the present embodiment include first terminals 272 and second terminals 275.

Referring to FIG. 7, each of the first terminals 272 of the present embodiment is made of metal. Specifically, each of the first terminals 272 has a first contact portion 273. Each of the first terminals 272 is held by the flat plate portion 216 of the first housing 215. The first contact portion 273 is positioned below the lower end of the flat plate portion 216 of the first housing 215.

Referring to FIG. 7, each of the second terminals 275 is made of metal. Specifically, each of the second terminals 275 has a second contact portion 276. Each of the second terminals 275 is held by the second housing 255. The second contact portion 276 is positioned above an upper end of the second housing 255 in the up-down direction.

Referring to FIG. 7, the shell 290 of the present embodiment is made of metal. Specifically, the shell 290 surrounds the housing 210 in a plane perpendicular to the front-rear direction.

As shown in FIG. 7, the tray receiving portion 205 of the present embodiment is a space which extends in the front-rear direction. Specifically, the tray receiving portion 205 has an opening 206 at its rear end. The tray receiving portion 205 is opened at its rear end and is closed at its front end. The tray receiving portion 205 is the space which receives the tray 300 when the tray 300 is inserted into the connector main 200 through the opening 206. The opening 206 is positioned at a rear end of the connector main 200 in the front-rear direction.

Referring to FIGS. 3 and 7, the tray 300 of the present embodiment is configured to be inserted forward in the front-rear direction into the connector main 200 of the card connector 100. More specifically, the tray 300 is configured to be inserted forward in the front-rear direction into the tray receiving portion 205 of the connector main 200.

As shown in FIG. 7, the tray 300 of the present embodiment has a first card accommodation portion 310, a first relief hole 392, a second card accommodation portion 340 and a second relief hole 394. Specifically, the tray 300 is provided with the first relief hole 392 and the second relief hole 394.

Figure 4:
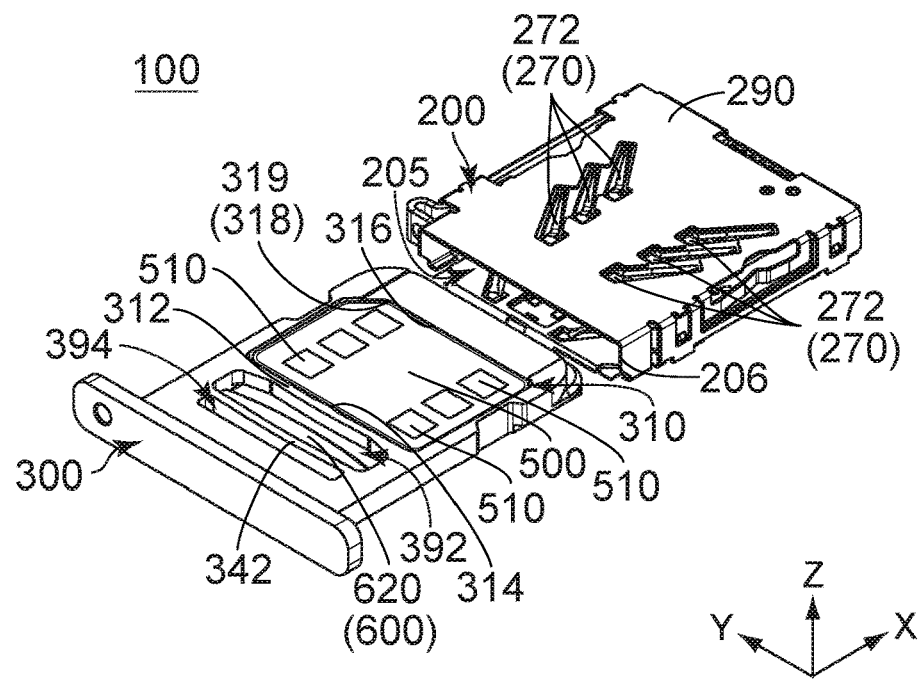
FIG. 4 is another perspective view showing the card connector of FIG. 1. In the figure, the card connector is in a pulled-out state where the tray is pulled out from the connector main.

As shown in FIG. 4, the first card accommodation portion 310 of the present embodiment is configured to accommodate a first card (card) 500.

Figure 8:
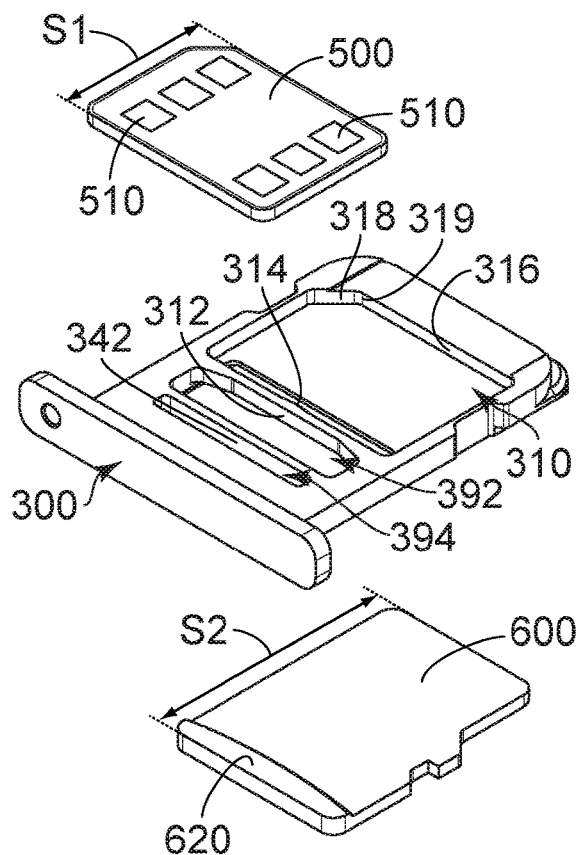
FIG. 8 is a perspective view showing the tray, a first card and a second card which are included in the card connector of FIG. 4.

Referring to FIG. 8, the first card 500 of the present embodiment is a nano SIM (Subscribed Identity Module) card 500 which has a plurality of pads 510. Referring to FIGS. 3, 4 and 7, under a received state where the tray 300, which accommodates the first card 500, is received in the connector main 200, the pads 510 of the first card 500 are connected with the first contact portions 273 of the first terminals 272, respectively, of the terminals 270 of the connector main 200.

Figure 9:
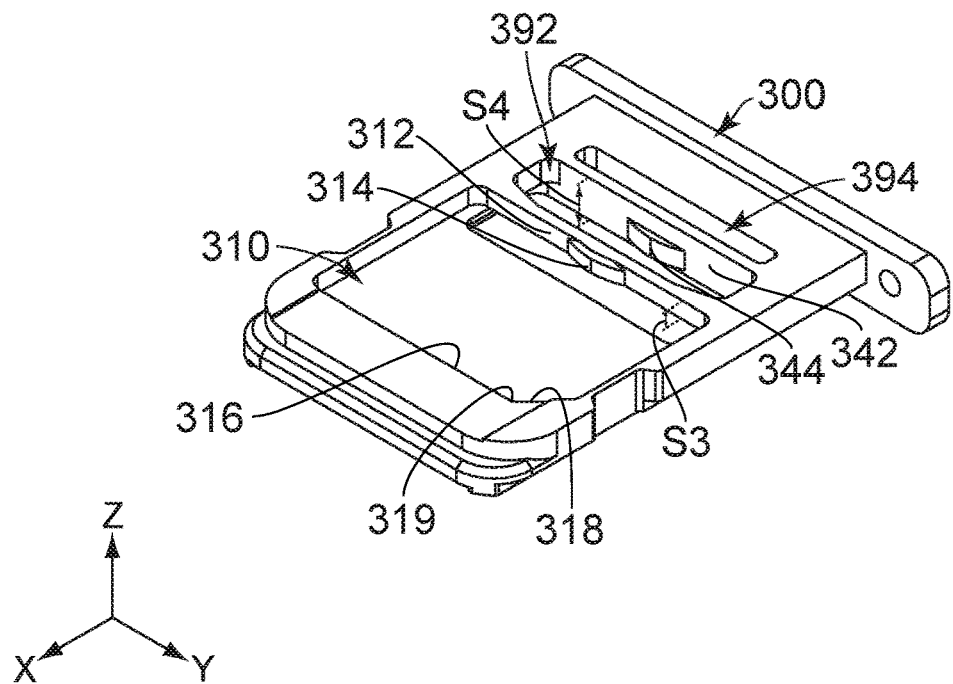
FIG. 9 is a perspective view showing the tray of FIG. 8.

As shown in FIG. 9, the first card accommodation portion 310 of the present embodiment is opened upward in the up-down direction. As shown in FIG. 7, the first card accommodation portion 310 is positioned at a position different from a position of the second card accommodation portion 340 in the up-down direction perpendicular to the front-rear direction. More specifically, the first card accommodation portion 310 is positioned above the second card accommodation portion 340 in the up-down direction. However, the present invention is not limited thereto. The first card accommodation portion 310 may be positioned below the second card accommodation portion 340 in the up-down direction.

As shown in FIG. 9, the first card accommodation portion 310 of the present embodiment has a first elastic beam portion 312, a first bulge 314, a first facing portion 316 and a first intersecting portion 318.

Figure 10:
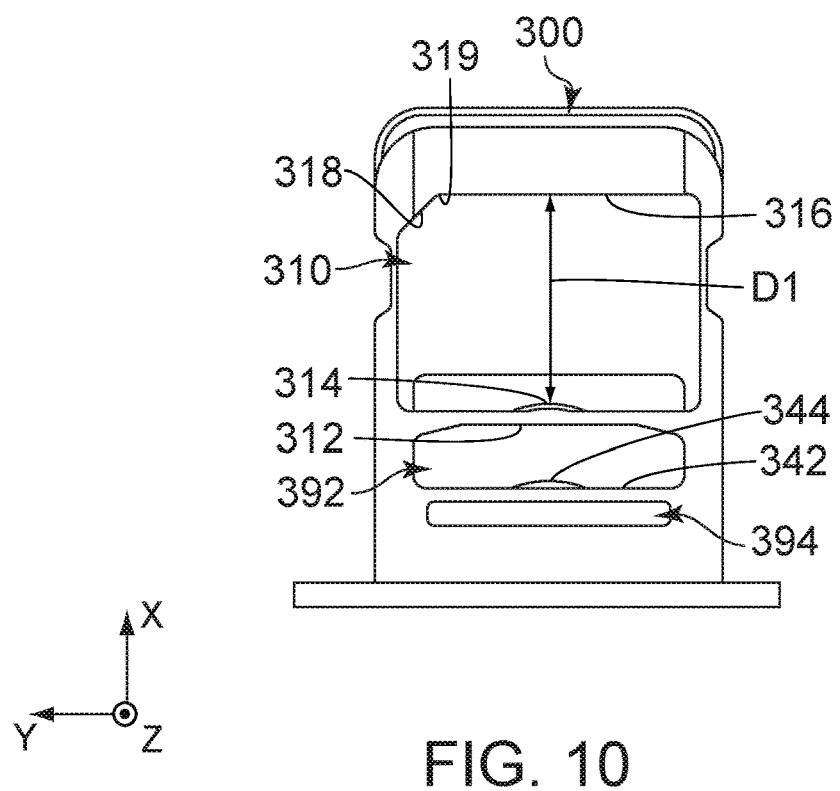
FIG. 10 is a top view showing the tray of FIG. 9.

As shown in FIG. 10, the first elastic beam portion 312 of the present embodiment extends in an intersecting direction which intersects with both the up-down direction and the front-rear direction. More specifically, the first elastic beam portion 312 extends in the width direction perpendicular to both the up-down direction and the front-rear direction. In other words, the intersecting direction of the present embodiment is the width direction. However, the present invention is not limited thereto. It is sufficient that the intersecting direction intersects with both the up-down direction and the front-rear direction. The first elastic beam portion 312 is a double-supported beam. The first elastic beam portion 312 is elastically deformable independently. Specifically, the first elastic beam portion 312 is elastically deformable independently of the second elastic beam portion 342. The first elastic beam portion 312 is positioned forward of the first relief hole 392 in the front-rear direction. A rear end of the first elastic beam portion 312 is a front end of the first relief hole 392.

As shown in FIG. 10, the first bulge 314 of the present embodiment is bulged toward the first facing portion 316 from the first elastic beam portion 312. Specifically, the first bulge 314 is bulged forward in the front-rear direction from the first elastic beam portion 312. The first bulge 314 is positioned at a middle of the first elastic beam portion 312 in the intersecting direction. More specifically, the first bulge 314 is positioned at the middle of the first elastic beam portion 312 in the width direction.

As shown in FIG. 10, the first facing portion 316 of the present embodiment faces the first elastic beam portion 312 in the front-rear direction. The first facing portion 316 is positioned forward of the first elastic beam portion 312 in the front-rear direction. The first facing portion 316 defines a front end of the first card accommodation portion 310.

Referring to FIGS. 8 and 10, in the front-rear direction, a distance dimension D1 between the first bulge 314 and the first facing portion 316 is smaller than a dimension S1 of the first card 500 which is configured to be accommodated in the first card accommodation portion 310. Accordingly, when the first card accommodation portion 310 accommodates the first card 500, the first elastic beam portion 312 is elastically deformed so that the first card accommodation portion 310 can rigidly hold the first card 500.

As shown in FIG. 8, the first intersecting portion 318 of the present embodiment intersects with both the front-rear direction and the width direction. The first intersecting portion 318 is coupled with the first facing portion 316 in the width direction. More specifically, a front end 319 of the first intersecting portion 318 is coupled with the first facing portion 316. The first intersecting portion 318 is positioned forward of the first elastic beam portion 312 in the front-rear direction. The first intersecting portion 318 is positioned forward of the first bulge 314 in the front-rear direction.

Referring to FIGS. 9 and 10, the first relief hole 392 of the present embodiment is positioned rearward of the first elastic beam portion 312 of the first card accommodation portion 310 in the front-rear direction and allows elastic deformation of the first elastic beam portion 312 of the first card accommodation portion 310. A position of the first relief hole 392 and a position of the first card accommodation portion 310 do not overlap with each other in the front-rear direction. The first relief hole 392 pierces the tray 300 to reach the second card accommodation portion 340. More specifically, the first relief hole 392 pierces the tray 300 to reach the second card accommodation portion 340 in the up-down direction.

As described above, the first facing portion 316 is positioned forward of the first elastic beam portion 312 in the front-rear direction while the first elastic beam portion 312 is positioned forward of the first relief hole 392 in the front-rear direction. However, the present invention is not limited thereto. The first facing portion 316, the first elastic beam portion 312 and the first relief hole 392 may be arranged in reverse order in the front-rear direction with respect to the present embodiment. In other words, the tray 300 may be arranged so that the first facing portion 316 is positioned rearward of the first elastic beam portion 312 while the first elastic beam portion 312 is positioned rearward of the first relief hole 392.

As shown in FIG. 3, the first relief hole 392 of the present embodiment is positioned rearward of any of the first terminals 272 of the terminals 270 of the connector main 200 under the received state where the tray 300 is received in the connector main 200. More specifically, referring to FIGS. 3 and 7, the first relief hole 392 is positioned rearward of any of the first contact portions 273 of the first terminals 272 of the terminals 270 of the connector main 200 under the received state where the tray 300 is received in the connector main 200. In other words, when the tray 300 is inserted into the tray receiving portion 205 of the connector main 200, none of the first contact portions 273 of the first terminals 272 of the terminals 270 of the connector main 200 passes just above the first relief hole 392 of the tray 300. In a case where the first facing portion 316, the first elastic beam portion 312 and the first relief hole 392 are arranged in the reverse order in the front-rear direction with respect to the present embodiment, the first contact portions 273 of the first terminals 272 of the terminals 270 of the connector main 200 pass just above the first relief hole 392 of the tray 300 when the tray 300 is inserted into the tray receiving portion 205 of the connector main 200. Thus, in the aforementioned case, the first terminal 272 may be abraded, or the first contact portion 273 of the first terminal 272 may be fit in the first relief hole 392 of the tray 300 so that the first terminal 272 may be buckled. Accordingly, the tray 300 of the present embodiment has no drawback as described above and is more preferable.

Figure 5:
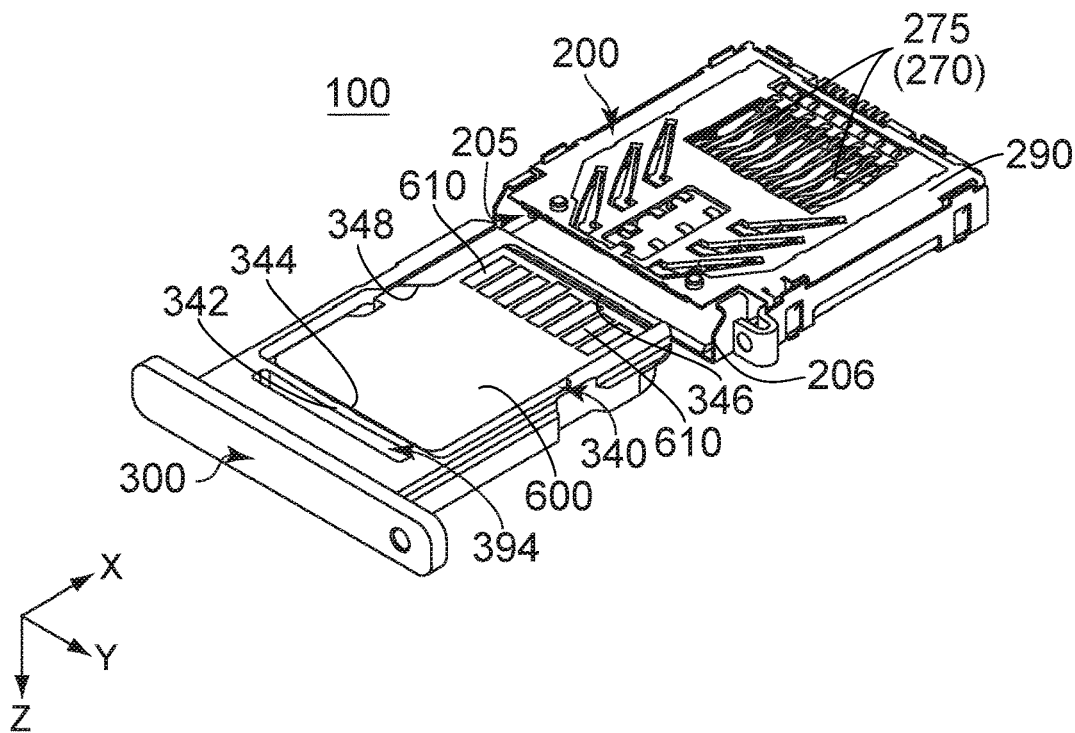
FIG. 5 is another perspective view showing the card connector of FIG. 4.

As shown in FIG. 5, the second card accommodation portion 340 of the present embodiment is configured to accommodate a second card (card) 600.

Referring to FIGS. 5 and 8, the second card 600 of the present embodiment is a micro SD (Secure Digital) card 600 which has a plurality of pads 610 and a protrusion 620. In other words, the second card (card) 600, which is configured to be accommodated in the second card accommodation portion 340, has the protrusion 620. Referring to FIGS. 3 and 5, under a received state where the tray 300, which accommodates the second card 600, is received in the connector main 200, the pads 610 of the second card 600 are connected with the second contact portions 276 of the second terminals 275, respectively, of the terminals 270 of the connector main 200.

As shown in FIG. 8, in the front-rear direction, a dimension S2 of the second card (card) 600, which is configured to be accommodated in the second card accommodation portion 340, is greater than the dimension S1 of the first card (card) 500 which is configured to be accommodated in the first card accommodation portion 310.

Figure 6:
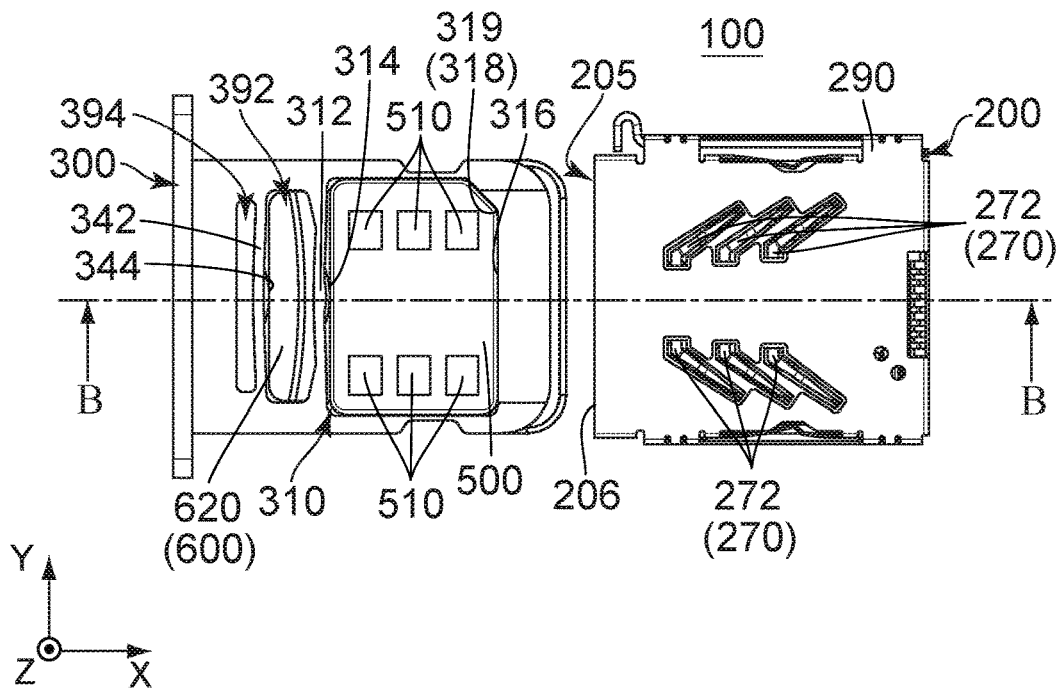
FIG. 6 is a top view showing the card connector of FIG. 4.

As shown in FIG. 7, the second card accommodation portion 340 of the present embodiment is opened downward in the up-down direction. The second card accommodation portion 340 is positioned below the first card accommodation portion 310 in the up-down direction. When the second card 600 is accommodated in the second card accommodation portion 340, the protrusion 620 is partially accommodated in the first relief hole 392. More specifically, as shown in FIG. 3, an upper part of the protrusion 620 is accommodated in the first relief hole 392 when the second card 600 is accommodated in the second card accommodation portion 340. At this time, as shown in FIG. 6, an outer periphery of the upper part of the protrusion 620 is positioned inward of inner walls of the first relief hole 392 in a direction perpendicular to the up-down direction. As described above, the position of the first relief hole 392 and the position of the first card accommodation portion 310 do not overlap with each other in the front-rear direction. Accordingly, a part of the tray 300, which accommodates the first card 500 and the second card 600, has a reduced dimension in the up-down direction in comparison with an assumption where a part of the tray 300, which accommodates the protrusion 620 upon accommodation of the second card 600 in the second card accommodation portion 340, be positioned to overlap with the first card accommodation portion 310 in the front-rear direction.

Figure 11:
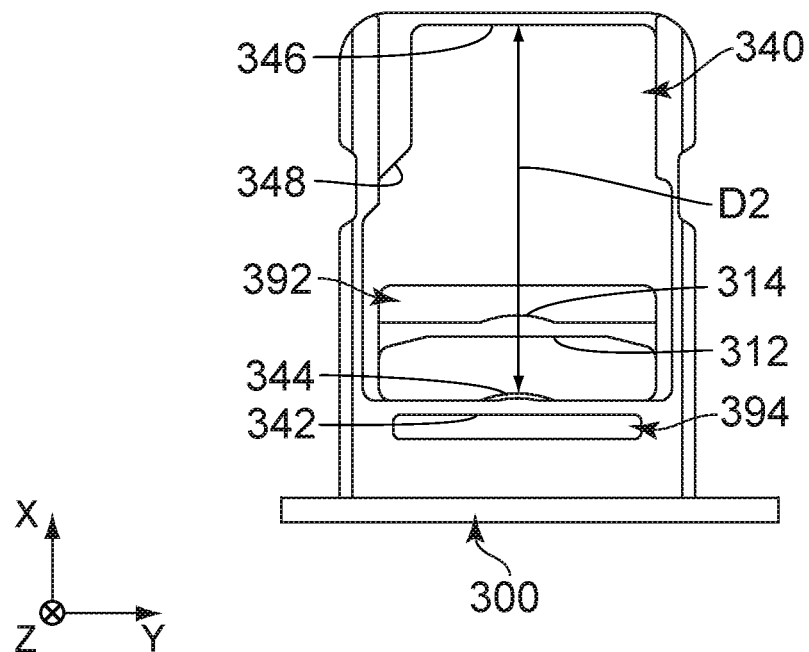
FIG. 11 is a bottom view showing the tray of FIG. 9.
Figure 12:
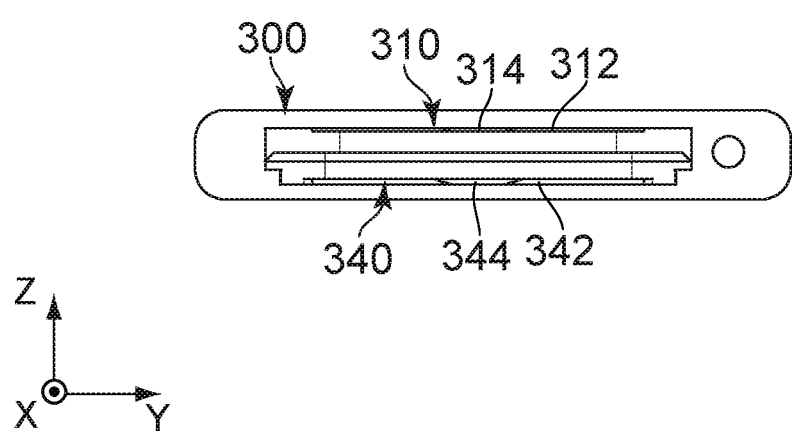
FIG. 12 is a front view showing the tray of FIG. 9.
Figure 13:
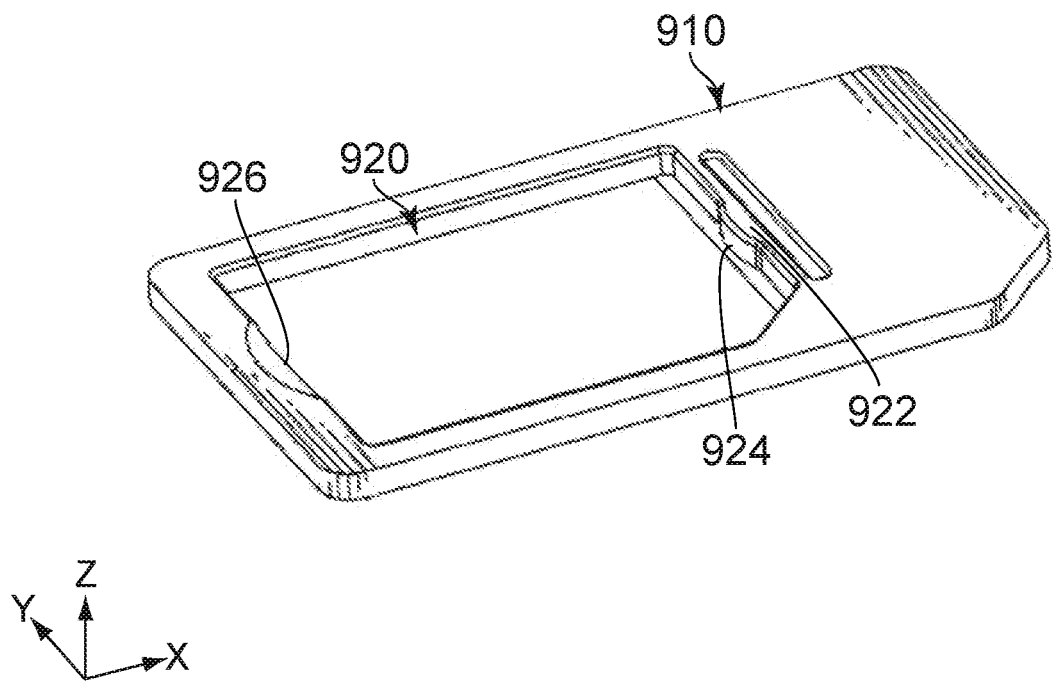
FIG. 13 is a perspective view showing a card convert adapter of Patent Document 1.
Figure 14:
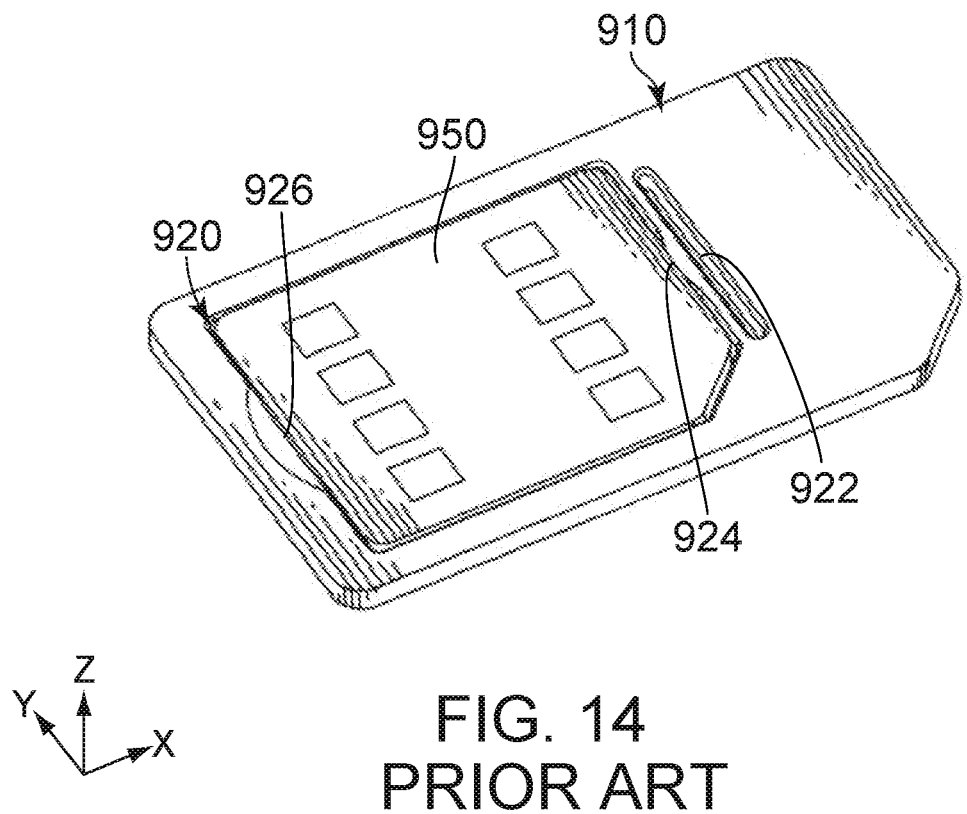
FIG. 14 is another perspective view showing the card convert adapter of FIG. 13. In the figure, a micro SIM card is accommodated in a card accommodation portion of the card convert adapter.

As shown in FIG. 11, the second card accommodation portion 340 of the present embodiment has a second elastic beam portion 342, a second bulge 344, a second facing portion 346 and a second intersecting portion 348.

As shown in FIG. 11, the second elastic beam portion 342 of the present embodiment extends in the intersecting direction which intersects with both the up-down direction and the front-rear direction. More specifically, the second elastic beam portion 342 extends in the width direction perpendicular to both the up-down direction and the front-rear direction. In other word, the intersecting direction of the present embodiment is the width direction. However, the present invention is not limited thereto. It is sufficient that the intersecting direction intersects with both the up-down direction and the front-rear direction. The second elastic beam portion 342 is a double supported beam. The second elastic beam portion 342 is elastically deformable independently. Specifically, the second elastic beam portion 342 is elastically deformable independently of the first elastic beam portion 312. The second elastic beam portion 342 is positioned between the first relief hole 392 and the second relief hole 394 in the front-rear direction. More specifically, in the front-rear direction, the second elastic beam portion 342 is positioned rearward of the first relief hole 392 and the forward of the second relief hole 394. A front end of the second elastic beam portion 342 is a rear end of the first relief hole 392. A rear end of the second elastic beam portion 342 is a front end of the second relief hole 394.

As described above, the first elastic beam portion 312 and the second elastic beam portion 342 of the present embodiment are elastically deformable independently of each other. Accordingly, each of the accommodation of the first card 500 into the first card accommodation portion 310 and the accommodation of the second card 600 into the second card accommodation portion 340 can be independently achieved in comparison with an assumption where the first elastic beam portion 312 and the second elastic beam portion 342 have a common part so that the first elastic beam portion 312 and the second elastic beam portion 342 be not elastically deformable independently of each other. Even if the first card 500 and the second card 600 have variations in shape or dimension, the first card accommodation portion 310 can appropriately hold the first card 500 while the second card accommodation portion 340 can appropriately hold the second card 600.

As shown in FIG. 10, the first elastic beam portion 312 and the second elastic beam portion 342 of the present embodiment are positioned at positions different from each other in the front-rear direction. More specifically, the second elastic beam portion 342 is positioned rearward of the first elastic beam portion 312 in the front-rear direction. The first elastic beam portion 312 and the second elastic beam portion 342 are positioned at positions same as each other in the width direction. In general, a card connector, which is configured to be arranged in a housing of a smartphone, etc., is required to have a reduced dimension in a width direction because the dimension of the card connector in the width direction directly influences a dimension of the housing of the smartphone, etc. In comparison with an assumption where the first elastic beam portion 312 and the second elastic beam portion 342 be positioned at positions different from each other in the width direction, the arrangement of the first elastic beam portion 312 and the second elastic beam portion 342 of the tray 300 of the present embodiment does not increase a dimension of a housing of such a smartphone, etc., in which the card connector 100 is arranged, and satisfies the requirement described above. Thus, the arrangement of the first elastic beam portion 312 and the second elastic beam portion 342 of the present embodiment is preferable.

As shown in FIG. 9, in the up-down direction, a dimension S4 of the second elastic beam portion 342 is greater than a dimension S3 of the first elastic beam portion 312. Specifically, the second elastic beam portion 342 has a spring force greater than a spring force of the first elastic beam portion 312. Accordingly, the second card accommodation portion 340 is configured to be able to accommodate the second card 600 whose dimension S2 is greater than the dimension S1 of the first card 500 which is configured to be accommodated in the first card accommodation portion 310.

As shown in FIG. 11, the second bulge 344 of the present embodiment is bulged toward the second facing portion 346 from the second elastic beam portion 342. Specifically, the second bulge 344 is bulged forward in the front-rear direction from the second elastic beam portion 342. The second bulge 344 is positioned at a middle of the second elastic beam portion 342 in the intersecting direction. More specifically, the second bulge 344 is positioned at the middle of the second elastic beam portion 342 in the width direction. The first bulge 314 and the second bulge 344 are positioned at positions same as each other in the width direction.

As shown in FIG. 11, the second facing portion 346 of the present embodiment faces the second elastic beam portion 342 in the front-rear direction. The second facing portion 346 is positioned forward of the second elastic beam portion 342 in the front-rear direction. The second facing portion 346 defines a front end of the second card accommodation portion 340.

Referring to FIGS. 8 and 11, in the front-rear direction, a distance dimension D2 between the second bulge 344 and the second facing portion 346 is smaller than the dimension S2 of the second card 600 which is configured to be accommodated in the second card accommodation portion 340. Accordingly, when the second card accommodation portion 340 accommodates the second card 600, the second elastic beam portion 342 is elastically deformed so that the second card accommodation portion 340 can rigidly hold the second card 600.

As shown in FIG. 11, the second intersecting portion 348 of the present embodiment intersects with both the front-rear direction and the width direction. The second intersecting portion 348 is positioned between the second elastic beam portion 342 and the second facing portion 346 in the front-rear direction. More specifically, in the front-rear direction, the second intersecting portion 348 is positioned forward of the second elastic beam portion 342 and rearward of the second facing portion 346.

Referring to FIGS. 9 and 11, the second relief hole 394 of the present embodiment pierces the tray 300 in the up-down direction. The second relief hole 394 is positioned rearward of the second elastic beam portion 342 in the front-rear direction and allows elastic deformation of the second elastic beam portion 342.

As described above, the second facing portion 346 is positioned forward of the second elastic beam portion 342 in the front-rear direction while the second elastic beam portion 342 is positioned forward of the second relief hole 394 in the front-rear direction. However, the present invention is not limited thereto. The second facing portion 346, the second elastic beam portion 342 and the second relief hole 394 may be arranged in reverse order in the front-rear direction with respect to the present embodiment. In other words, the tray 300 may be arranged so that the second facing portion 346 is positioned rearward of the second elastic beam portion 342 while the second elastic beam portion 342 is positioned rearward of the second relief hole 394.

As shown in FIG. 3, the second relief hole 394 of the present embodiment is positioned rearward of any of the second terminals 275 of the terminals 270 of the connector main 200 under the received state where the tray 300 is received in the connector main 200. More specifically, the second relief hole 394 is positioned rearward of any of the second contact portions 276 of the second terminals 275 of the terminals 270 of the connector main 200 under the received state where the tray 300 is received in the connector main 200. In other words, when the tray 300 is inserted into the tray receiving portion 205 of the connector main 200, none of the second contact portions 276 of the second terminals 275 of the terminals 270 of the connector main 200 passes just below the second relief hole 394 of the tray 300. In a case where the second facing portion 346, the second elastic beam portion 342 and the second relief hole 394 are arranged in the reverse order in the front-rear direction with respect to the present embodiment, the second contact portions 276 of the second terminals 275 of the terminals 270 of the connector main 200 pass just below the second relief hole 394 of the tray 300 when the tray 300 is inserted into the tray receiving portion 205 of the connector main 200. Thus, in the aforementioned case, the second terminal 275 may be abraded, or the second contact portion 276 of the second terminal 275 may be fit in the second relief hole 394 of the tray 300 so that the second terminal 275 may be buckled. Accordingly, the tray 300 of the present embodiment has no drawback as described above and is more preferable.

Although the specific explanation about the present invention is made above referring to the embodiments, the present invention is not limited thereto and is susceptible to various modifications and alternative forms.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A tray insertable forward in a front-rear direction into a connector main of a card connector, wherein:
   the tray has a first card accommodation portion and a second card accommodation portion;
   the first card accommodation portion is configured to accommodate a first card;
   the first card accommodation portion is positioned at a position different from a position of the second card accommodation portion in an up-down direction perpendicular to the front-rear direction;
   the first card accommodation portion has a first elastic beam portion, a first facing portion and a first bulge;
   the first facing portion faces the first elastic beam portion in the front-rear direction;
   the first bulge is bulged toward the first facing portion from the first elastic beam portion;
   the second card accommodation portion is configured to accommodate a second card;
   the second card accommodation portion has a second elastic beam portion, a second facing portion, and a second bulge;
   the second facing portion faces the second elastic beam portion in the front-rear direction;
   the second bulge is bulged toward the second facing portion from the second elastic beam portion;
   the first elastic beam portion and the second elastic beam portion are positioned at positions different from each other in the front-rear direction;
   the first elastic beam portion and the second elastic beam portion are elastically deformable independently of each other;
   the first facing portion is positioned forward of the first elastic beam portion in the front-rear direction;
   the second facing portion is positioned forward of the second elastic beam portion in the front-rear direction;
   the second elastic beam portion is positioned rearward of the first elastic beam portion in the front-rear direction;
   the tray is provided with a first relief hole and a second relief hole;
   the first relief hole is positioned rearward of the first elastic beam portion in the front-rear direction and allows elastic deformation of the first elastic beam portion;
   the second relief hole is positioned rearward of the second elastic beam portion in the front-rear direction and allows elastic deformation of the second elastic beam portion;
   the first relief hole pierces the tray to reach the second card accommodation portion;
   the second card is provided with a protrusion; and
   when the second card is accommodated in the second card accommodation portion, the protrusion is partially accommodated in the first relief hole.

2. The tray as recited in claim 1, wherein each of the first elastic beam portion and the second elastic beam portion extends in an intersecting direction which intersects with both the up-down direction and the front-rear direction.

3. The tray as recited in claim 2, wherein:
   the first bulge is positioned at a middle of the first elastic beam portion in the intersecting direction; and
   the second bulge is positioned at a middle of the second elastic beam portion in the intersecting direction.

4. The tray as recited in claim 1, wherein:
   in the front-rear direction, a distance dimension between the first bulge and the first facing portion is smaller than a dimension of the first card; and
   in the front-rear direction, a distance dimension between the second bulge and the second facing portion is smaller than a dimension of the second card.

5. The tray as recited in claim 1, wherein:
   in the front-rear direction, a dimension of the second card is greater than a dimension of the first card; and
   in the up-down direction, a dimension of the second elastic beam portion is greater than a dimension of the first elastic beam portion.

6. The tray as recited in claim 1, wherein each of the first elastic beam portion and the second elastic beam portion is a double-supported beam.

7. A tray insertable forward in a front-rear direction into a connector main of a card connector, wherein:
   the tray has a first card accommodation portion and a second card accommodation portion;
   the first card accommodation portion is configured to accommodate a first card;

the first card accommodation portion is positioned at a position different from a position of the second card accommodation portion in an up-down direction perpendicular to the front-rear direction;

the first card accommodation portion has a first elastic beam portion, a first facing portion and a first bulge;

the first facing portion faces the first elastic beam portion in the front-rear direction;

the first bulge is bulged toward the first facing portion from the first elastic beam portion;

the second card accommodation portion is configured to accommodate a second card;

the second card accommodation portion has a second elastic beam portion, a second facing portion, and a second bulge;

the second facing portion faces the second elastic beam portion in the front-rear direction;

the second bulge is bulged toward the second facing portion from the second elastic beam portion;

the first elastic beam portion and the second elastic beam portion are positioned at positions different from each other in the front-rear direction;

the first elastic beam portion and the second elastic beam portion are elastically deformable independently of each other;

the first facing portion is positioned forward of the first elastic beam portion in the front-rear direction;

the second facing portion is positioned forward of the second elastic beam portion in the front-rear direction;

the second elastic beam portion is positioned rearward of the first elastic beam portion in the front-rear direction;

the tray is provided with a first relief hole and a second relief hole;

the first relief hole is positioned rearward of the first elastic beam portion in the front-rear direction and allows elastic deformation of the first elastic beam portion;

the second relief hole is positioned rearward of the second elastic beam portion in the front-rear direction and allows elastic deformation of the second elastic beam portion;

in the front-rear direction, a dimension of the second card is greater than a dimension of the first card; and in the up-down direction, a dimension of the second elastic beam portion is greater than a dimension of the first elastic beam portion.

\* \* \* \* \*